United States Patent
Hamlin et al.

(10) Patent No.: US 12,047,066 B2
(45) Date of Patent: Jul. 23, 2024

(54) HYBRID DIGITAL-ANALOG AUTOMATIC LEVEL CONTROL (ALC) USING VECTOR SIGNAL GENERATORS (VSG)

(71) Applicant: VIAVI SOLUTIONS INC., Chandler, AZ (US)

(72) Inventors: Sean Hamlin, Chandler, AZ (US); Paul Hamlin, Chandler, AZ (US)

( * ) Notice: Subject to any disclaimer, the term of this patent is extended or adjusted under 35 U.S.C. 154(b) by 39 days.

(21) Appl. No.: 17/823,297

(22) Filed: Aug. 30, 2022

(65) Prior Publication Data
US 2023/0069759 A1   Mar. 2, 2023

Related U.S. Application Data
(60) Provisional application No. 63/239,229, filed on Aug. 31, 2021.

(51) Int. Cl.
*H03K 19/0175* (2006.01)
*G06F 30/38* (2020.01)

(52) U.S. Cl.
CPC ..... *H03K 19/017509* (2013.01); *G06F 30/38* (2020.01)

(58) Field of Classification Search
None
See application file for complete search history.

(56) References Cited

U.S. PATENT DOCUMENTS

| | | | | |
|---|---|---|---|---|
| 7,392,027 B2* | 6/2008 | Ishihara | ............... | H03G 3/3068 |
| | | | | 455/436 |
| 8,699,984 B2* | 4/2014 | Mendoza | ............. | H04B 1/1027 |
| | | | | 455/150.1 |
| 10,075,134 B2* | 9/2018 | Shute | .................... | H03F 1/0211 |

OTHER PUBLICATIONS

Glen M. Baker, Mark N. Davidson, and Lance E. Haag, "A High-Performance Sweeper Output Power Leveling System," Hewlett-Packard Journal, vol. 42-2, pp. 24-30, (Apr. 1991).

William D. Baumgartner, John S. Brenneman, John L. Imperator, et al., "A New High-Performance 0.01-to-20-GHz Synthesized Signal Generator Microwave Chain," URL: https://www.hpl.hp.com/hpjournal/pdfs/IssuePDFs/1993-04.pdf , Hewlett-Packard Journal, vol. 44-2, pp. 17-29, (Apr. 1993).

* cited by examiner

*Primary Examiner* — Jeffrey S Zweizig
(74) *Attorney, Agent, or Firm* — DLA Piper LLP (US)

(57) ABSTRACT

A hybrid automatic level control (ALC) system for controlling analog outputs. Within the ALC, a feedback loop passes from an analog circuit to a digital circuit and may provide the level of the analog output to the digital circuit. The digital circuit may use lookup tables to model the responses of analog devices but without associated errors and complications of the analog domain. Some examples of the modeled response include linear frequency responses of analog diodes and frequency responses of analog filters. Based on the received feedback and using the lookup tables modeling the responses, the digital circuit may drive a digital-to-analog converter interfacing the analog circuit to control the level of the analog output.

17 Claims, 13 Drawing Sheets

HYBRID DIGITAL-ANALOG AUTOMATIC LEVEL CONTROL (ALC) USING VECTOR SIGNAL GENERATORS (VSG)

CROSS-REFERENCE TO RELATED APPLICATION

This application claims priority to of U.S. Provisional Application No. 63/239,229, filed Aug. 31, 2021, the entire disclosure of which has been incorporated by reference herein.

BACKGROUND

Any type of electronic circuitry, especially communication circuitry (e.g., radio frequency circuitry) is prone to errors. There may be unwanted attenuations and gains, and errant frequency responses leading to an inaccurate functioning of the circuitry. For example, FIG. 1 illustrates electronic circuitry 10 with multiple error sources. As shown, the electronic circuitry 10 includes a digital-to-analog (DAC) convertor 12 having an output connected to an input of a bandpass filter 14. The output of the bandpass filter 14 is coupled to an input of a mixer 16, which has another input connected to an adjustable AC source 18. The output of the mixer 16 is passed through a low pass filter 20 and then a buffer 22 before being applied to a variable attenuator 24. The output of the attenuator 24 is connected to a device under test (DUT) 30 through an output connector 26. Within this electronic circuitry 10, components such as the mixer 16, low pass filter 20, or the buffer 22 may introduce frequency response errors. In other words, the frequency responses for these components may not be as clean as desired and thereby may suppress some desired frequencies. Components such as the variable attenuator 24 may introduce linearity errors with the attenuation not being applied equally across the waveform. Furthermore, there may be a mismatch error between the output connector 26 and the DUT 30.

There may be other errors such as voltage standing wave ration (VSWR) errors, time and temperature drift, calibration uncertainty, lack of repeatability, etc.

Automatic level control (ALC) systems have been developed to mitigate these errors. ALCs may generally use a feedback control mechanism to control the output level of a component (e.g., output level of the mixer 16) in response to an error condition in the component itself or other neighboring components. For example, if the lowpass filter 20 is adding an unwanted gain, the output level of the mixer 16 may be concomitantly reduced to accommodate the unwanted gain such that the buffer 22 receives the desired level.

FIG. 2 shows a conventional ALC system 50, which may automatically control the level of output 64 to mitigate errors introduced into the signal by its internal components and or other neighboring components. In the illustrated example, the ALC system 50 includes an AC source 52 whose output may be connected to an ALC modulator 54. The output of the ALC modulator 54 may be buffered using a buffer 56, and then sent to an output attenuator 62 through a first resistor 60. The output of the modulator 54 may also be passed through a feedback loop comprising a second resistor 58, diode 66, summer 68 and an integrator 70. A capacitor 72 is also shown as being coupled between the input and output of the integrator 70. A control voltage $V_{CTRL}$ may be applied to the positive input of the summer 68 while the output of the modulator is applied to the negative input of the summer 68.

The ALC system 50 may use a two-tiered (coarse and fine) control approach. The first tier includes coarse output attenuation. For example, the output attenuator 62 is calibrated to operate linearly in relatively large step sizes (e.g., 5 dB). This coarse attenuation may improve generator (source) VSWR. The second tier may include the ALC modulator 54 and its associated feedback look. This second tier may provide a fine resolution within the relatively large output attenuator 62 steps. Such fine resolution may be calibrated across frequency and may also mitigate temperature movements. Moreover, the fine resolution may also correct any VSWR mismatch between the source and DUT.

Notwithstanding these benefits, conventional ALCs have several technical shortcomings. In particular, there are response and control errors. For example, there is non-linear diode response such that the gain changes exponentially across diode operating regions resulting in non-constant loop gain and bandwidth. A voltage variable attenuator is often implemented with PIN diodes, which may require a high voltage (HV) bias and linearization circuit (e.g., a log amplifier). This type of attenuator also may have poor third order intercept points (IP3) at low frequencies, which is also an undesirable condition.

In addition to the non-linearity introduced by the diodes, conventional ALCs also have envelope modulation errors. Due to the mismatch between different components, a significantly large ALC bandwidth may be required to achieve a much smaller modulation rate. The mismatch may further induce uncorrectable errors. Variation of temperature may introduce level drifts. Furthermore, for frequency sweeps, a constant alignment of the control voltage ($V_{CTRL}$) with the sweep may be required.

Accordingly, there is a need and desire for a significantly improved ALC that is significantly less error prone than conventional ALCs described above.

SUMMARY

Embodiments disclosed herein provide a hybrid automatic level control (ALC) system for controlling analog outputs. Within the disclosed ALC, a feedback loop passes from an analog circuit to a digital circuit and may provide the level of the analog output to the digital circuit. The digital circuit may use lookup tables to model the responses of analog devices, but without associated errors and complications of the analog domain. Some examples of the modeled response include linear frequency responses of analog diodes and frequency responses of analog filters. Based on the received feedback and using the lookup tables modeling the responses, the digital circuit may drive a digital-to-analog converter interfacing the analog circuit to control the level of the analog output.

In one or more embodiments, an automatic level control system is provided, which may comprise an analog circuit configured to provide a modulated analog output; a digital circuit configured to control the modulated analog output; a feedback loop from the analog circuit to the digital circuit and configured to transmit the level of the modulated analog output to the digital circuit, wherein the digital circuit is further configured to drive a digital-to-analog converter interfacing the analog circuit to control the level of the modulated analog output based on the input received from the feedback loop.

In one or more embodiments, a method of automatic level control is provided. The method may comprise providing, by an analog circuit of an automatic level controller, a modulated analog output and controlling, by a digital circuit of the automatic level controller, the modulated analog output. The method may also comprise transmitting, by a feedback loop from the analog circuit to the digital circuit, a level of the modulated analog output to the digital circuit. The method may further comprise driving, by the digital circuit, a digital-to-analog converter interfacing the analog circuit to control the level of the modulated analog output based on an input received from the feedback loop.

In one or more embodiments, an automatic level control circuit is provided. The automatic level control circuit may comprise an analog portion configured to provide a modulated analog output and a digital portion configured to control the modulated analog output. The automatic level control circuit may also comprise a feedback loop from the analog portion to the digital portion and configured to transmit the level of the modulated analog output to the digital portion. The digital portion may be further configured to drive a digital-to-analog converter interfacing the analog portion to control the level of the modulated analog output based on input received from the feedback loop.

DETAILED DESCRIPTION OF SEVERAL EMBODIMENTS

Embodiments disclosed herein describe significantly improved ALCs that mitigate the several errors of the conventional ALCs. An ALC, according to the embodiments disclosed herein, may be use a hybrid analog and digital processing to avoid the various errors introduced in the analog domain components. The modulation is provided from a digital-to-analog converter (DAC) and does not require a high bandwidth. Furthermore, the feedback mechanism for level control encompasses both the analog and digital domains: Output levels to be corrected may be sensed in the analog domain and the corrections may be applied in the digital domain, thereby avoiding the errors of the analog domain. Due to the digital domain control, linearizing circuitry such as a log amplifier may not be required. Furthermore, the digital domain control also eliminates the voltage variable attenuator used for attenuation in the analog domain. Additionally, the digital domain control may also allow for multi-mode control schemes, which is not available in the analog domain.

Figure 1:
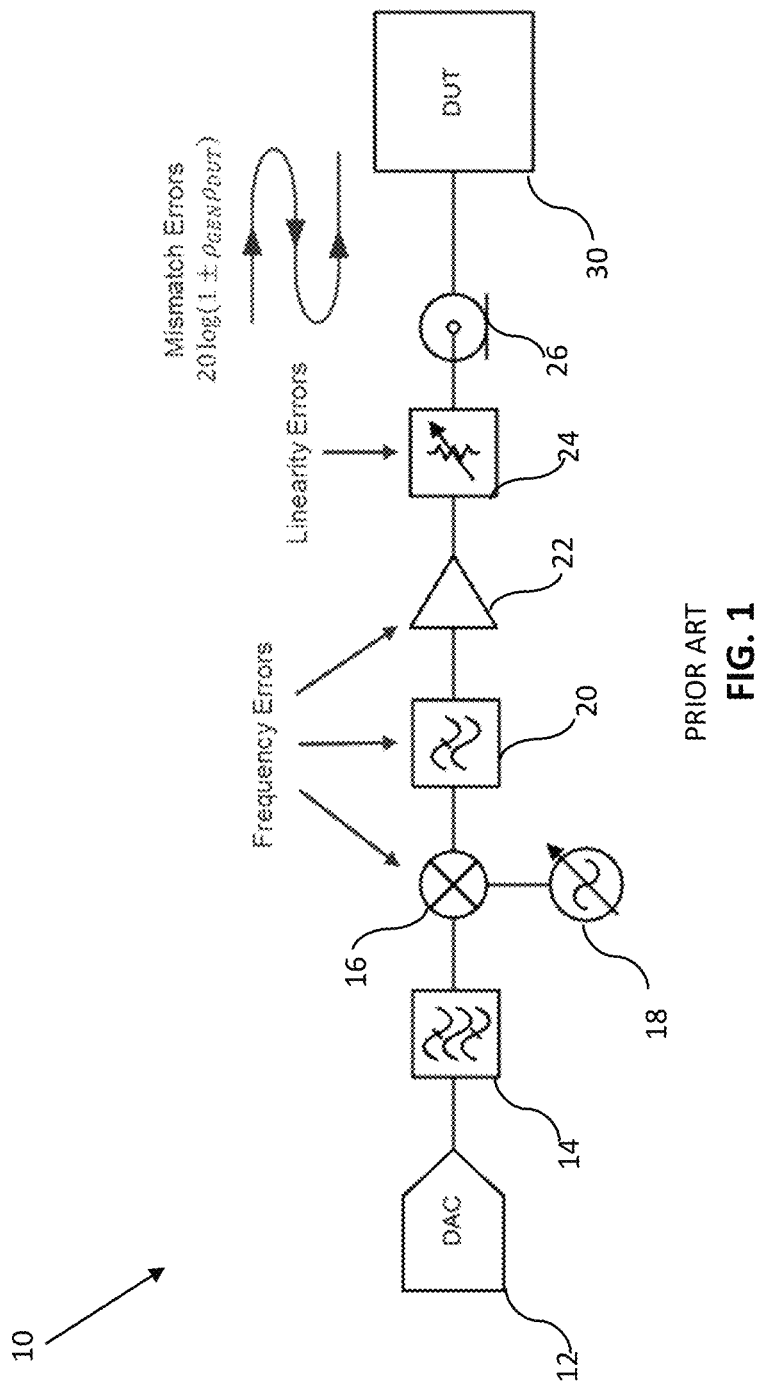
FIG. 1 shows an electronic circuitry and associated errors.
Figure 2:
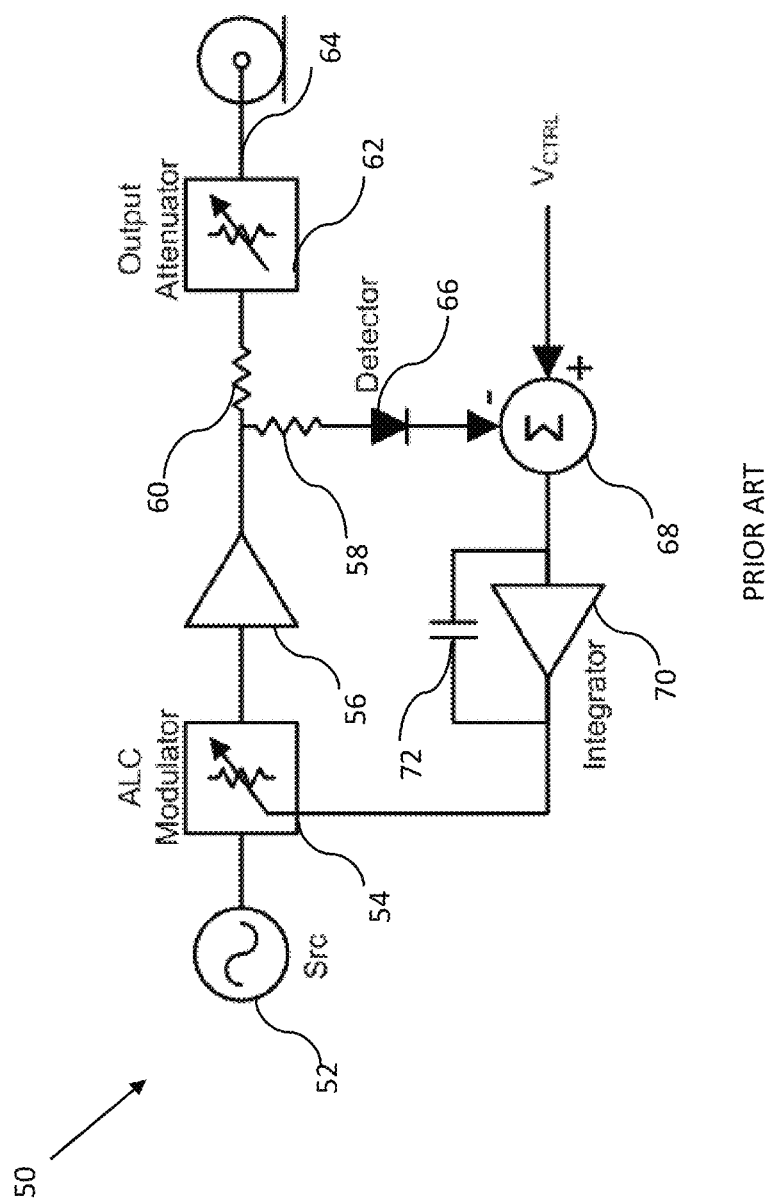
FIG. 2 shows a conventional automatic level control (ALC) system.
Figure 3:
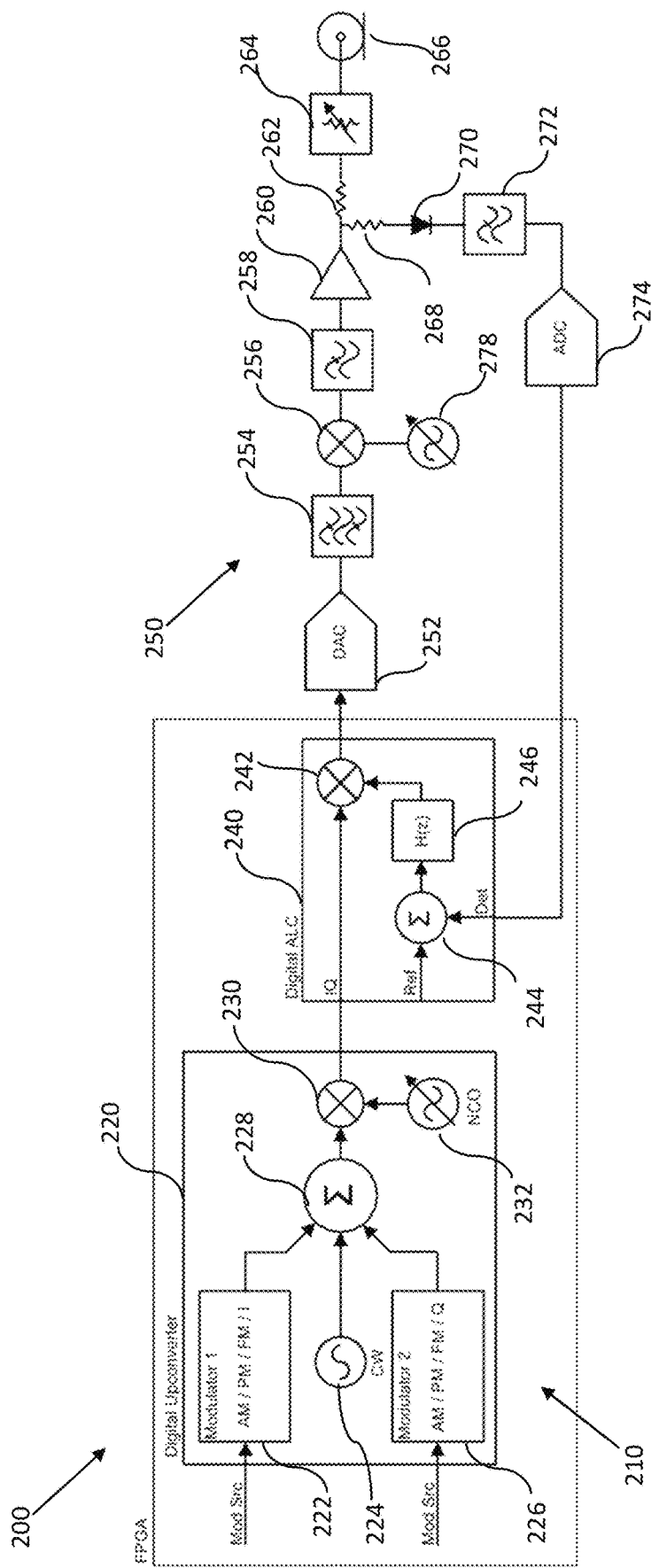
FIG. 3 shows an example of a hybrid ALC system, in accordance with the disclosed principles.

FIG. 3 illustrates an ALC system 200 in accordance with the disclosed principles. The ALC system 200 may also be referred to as automatic level controller or automatic level control circuit. The ALC system 200 may include a digital signal generator circuit 210 having a digital upconverter (DUC) 220 and a digital ALC 240. The ALC system 200 may also include an analog signal generator circuit 250. The digital signal generator circuit 210, comprising the digital upconverter 220 and digital ALC 240, may be implemented using a field programmable gate array (FPGA). In the ALC system 200, the digital upconverter 220 or the digital signal generator circuit 210 may be considered a vector signal generator (VSG).

The illustrated digital upconverter 220 may include modulators 222, 226 whose outputs are connected to a summer 228. Each modulator 222, 226 may input a source signal (Mod src) and may provide a modulated output to the summer 228. The first modulator 222 may provide AM, PM, FM, or in-phase (I) modulation signals while the second modulator 222 may provide AM, PM, FM, or quadrature (q) modulation signals. The digital upconverter 220 may also include a continuous waveform (CW) source 224 having an output connected to the input of the summer 228. The output of the summer may be connected to an input of a mixer 230. A second input of the mixer 230 may be connected to an output of a numerically controlled oscillator (NCO) 232. The NCO 232 may be a digital signal generator, which synthesizes a discrete-time, discrete-valued representation of a sinusoidal waveform.

The output of the mixer 230 may be an input to a mixer 242 of the digital ALC 240. The digital ALC 240 may also include a summer 244 and a digital compensation circuit 246. The summer 244 may receive as inputs a reference signal Ref and a detection signal Det. The output of the digital compensation circuit 246 may be input by the mixer 242, which may then output a digital source signal to the analog signal generator circuit 250.

The analog signal generator circuit 250 may include digital-to-analog (DAC) convertor 252 having an output connected to an input of a bandpass filter 254. The output of the filter 254 may be coupled to an input of a mixer 256, which may have another input connected to an adjustable AC source 278. The output of the mixer 256 may be passed through a low pass filter 258, a buffer 260 and a resistor 262 before being applied to a variable attenuator 264. The output of the attenuator 264 may be connected to a device under test (not shown) through an output connector 266.

The ALC system 200 may also include a feedback portion connected to the digital ALC 240. For example, a second resistor 268 may be connected to the output of the buffer 260 at a node where the first resistor 262 is connected. The second resistor 268 may be connected to a diode 270 that is coupled to a low pass filter 272 whose output is connected to an analog-to-digital converter (ADC) 274. The output of the ADC 274 may be the detection signal Det input by the summer 244 within the digital ALC 240.

In the ALC system 200 therefore, the level control of an analog output is performed in the digital domain. The feedback loop that crosses from the analog domain (analog signal generating circuit 250) to the digital domain (digital signal generating circuit 210) may control the signal levels in the analog domain through the input of the DAC 252. Therefore, the analog signal level control, performed in the digital domain, does not have the complications and errors of the control in the analog domain.

Figure 4:
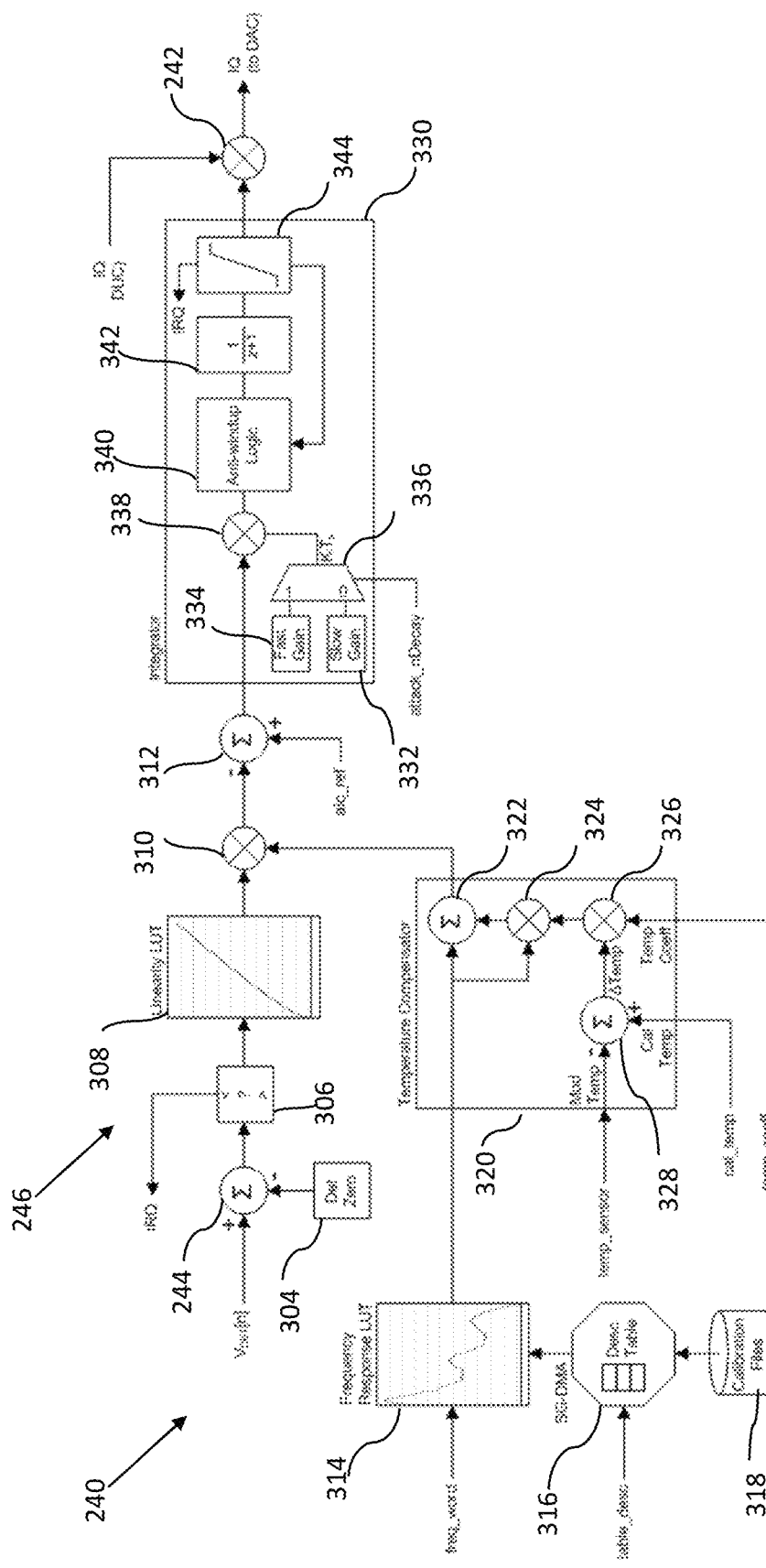
FIG. 4 shows another example of the hybrid ALC system, in accordance with the disclosed principles.

FIG. 4 illustrates an example embodiment of the digital ALC 240 constructed in accordance with the disclosed principles. The illustrated example includes components such as a linearity response lookup table (LUT) 308, a frequency response LUT 314, a temperature compensator 320, and an integrator 330.

The linearity response LUT 308 may have an output connected to a mixer 310 that may receive an output from the temperature compensator 320. The detection voltage $V_{DET}[n]$ from the ADC 274 (FIG. 3) may be an input to a positive input of the summer 244. A negative input of the summer 244 may be connected to a reference voltage source 304. The output of the summer 244 may be input at a comparator block 306. With this arrangement, a diode detector may be sampled directly with a precision ADC 274 (FIG. 3). Zeroing and range limiting may be performed by subtracting the diode DC offset value; detector values outside specified limits may not propagate (loop may not update) and trough errors may be avoided due to diode response. This may be useful for pulses. For linearization purposes, the control mechanism may the modulation of the IQ data stream (amplitude and not power) and the ADC values may be fed to LUT 308 to generate an output proportional to the envelope peak voltage. The use of the LUT 308 in the digital domain may avoid the various errors associated with generating the output in the analog domain.

Figure 5:
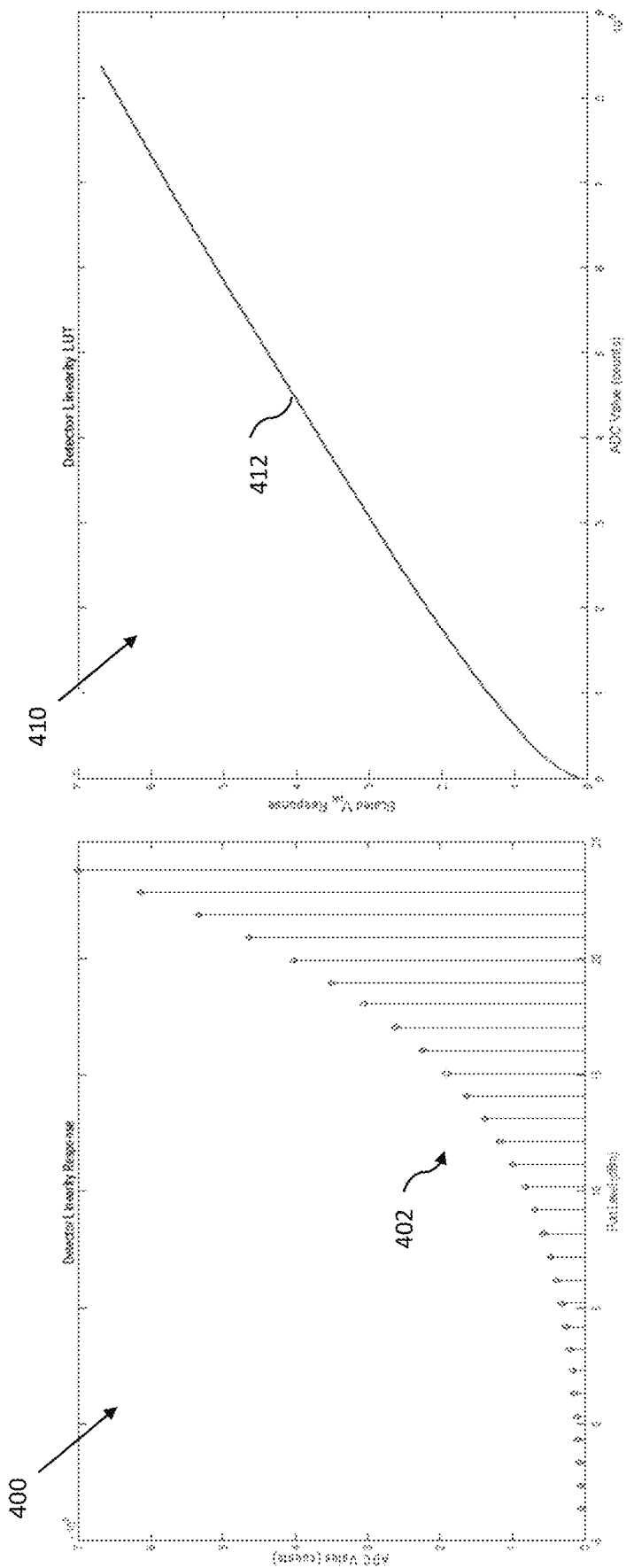
FIG. 5 shows an example of a modeled linear response of a diode of the hybrid ALC system, in accordance with the disclosed principles.

FIG. 5 illustrates graphs 400, 410 used for preparing the detector linearity response LUT 308, or, in other words, populating the LUT 308. Graph 400 represents the linearity response and plots ADC values (counts) versus port level (in dBm) such as an output port level. Multiple plots lines 402 show the relationship between the ADC values and port levels. Graph 410 represents the linearity response LUT 308 and plots a scaled response versus the ADC values (counts). Plot line 412 shows the relationship of the scaled responses and ADC values as stored in the LUT 308.

In accordance with the disclosed principles, the diode linearity response may be splined to the linear range across the ADC data range according to the LUT's 308 depth. Port dBm values are converted to $V_{PK}$. In one embodiment, $V_{PK}$ can be determined as follows:

$$V_{PK} = \sqrt{2 \cdot Z_{ref} \cdot 1 \text{ mW}} \cdot 10^{\frac{P_{dBm}}{20}}.$$

In one or more embodiments, $V_{PK}$ values are scaled according to a maximum settable power and ADC data range, which can be determined as follows:

$$C = \frac{2^{ADC-1}}{V_{PK_{max}}}$$

Therefore, using LUT 308 in the digital domain, a diode linearity in the analog response may be approximated. The non-linearity errors of the diodes (e.g., PIN diodes) in the analog domain may be avoided.

Figure 6:
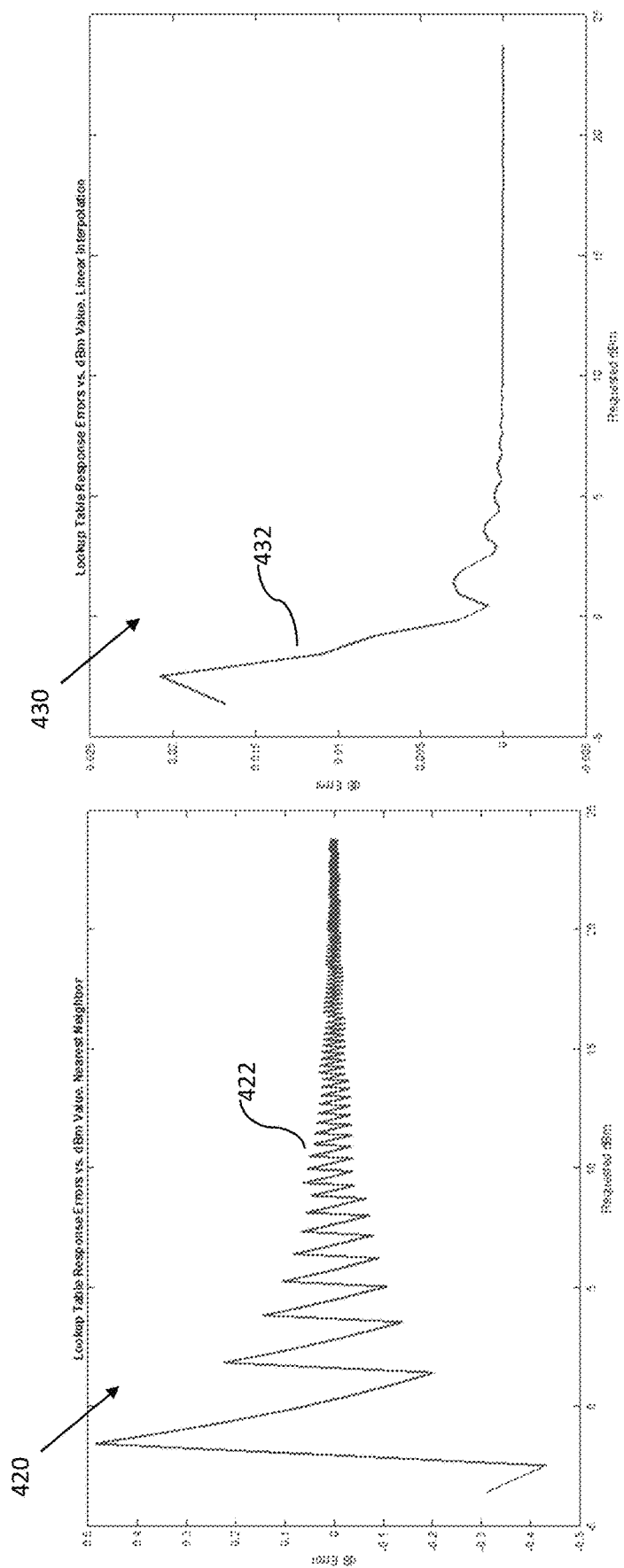
FIG. 6 shows an example of error rates versus depth of lookup tables modeling diode response, in accordance with the disclosed principles.

FIG. 6 illustrates graphs 420, 430 illustrating the LUT 308 depth versus accuracy. Graph 420 represents the LUT's response errors versus dBm values (using a nearest neighbor approach). Specifically, graph 420 plots 422 the dB error against the requested dBm using the nearest neighbor approach. Graph 430 represents the LUT's errors versus dBm values (using a linear interpretation approach). Specifically, graph 430 plots 432 the dB error against the requested dBm using a linear interpretation approach.

In accordance with the disclosed principles, the LUT 308 depth determines accuracy, which translates to absolute accuracy and linearity. The nominal diode operation point is located in the envelope region with a worst case deviation <+/−12 dB. As can be seen by the graphs 420, 430, linear interpolation reduces the LUT's 308 size by 100 times compared to the nearest neighbor determinations.

Referring again to FIG. 4, the frequency response LUT 314 may be indexed by a frequency word freq_word (discussed below in more detail) and has an output that may be sent to the temperature compensator 320 (for temperature based augmentation). In one or more embodiments, the frequency response LUT 314 stores a concatenated value of gain[n] (gain at the current step) and difference[n] (difference between the gain between the current step and the next step), which equals gain[n+1]−gain[n]. Gain may then be scaled to accommodate the maximum correction value (e.g., +6 dB, +12 dB, ... ). Therefore, the frequency response in the analog domain is generated by the frequency words of the LUT 314 in the digital domain.

In one or more embodiments, the frequency word freq_word, for the LUT 314, may be determined as follows:

$$\text{freq\_word} = \frac{RF \text{ Frequency} - \text{Table Start Frequency}}{\text{Table Spacing}} \cdot 2^{Word\ Width - TableDepth}.$$

In the illustrated example, the frequency word width is greater than the table depth and the gain (gain[n]) is linearly interpolated using the difference value (difference[n]) on every clock cycle. In the illustrated example, the loading of values for the LUT 314 may include retrieving hardware state values from calibration files 318 or backed up memory into the hardware description tables 316 inputting hardware descriptors table_desc and updating the LUT 314 via SG-DMA (scatter-gather direct memory access). In one or more embodiments, the LUT 314 is stored in a BRAM (block random access memory).

Figure 7:
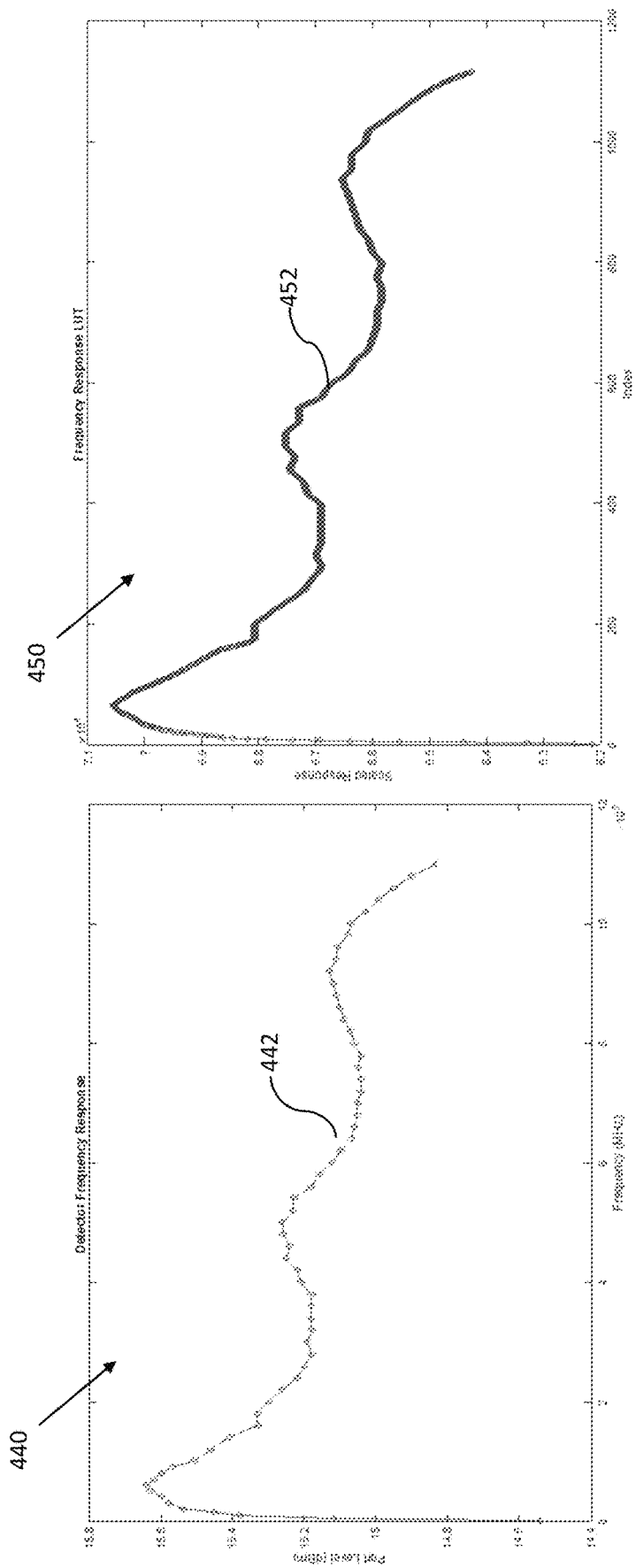
FIG. 7 shows an example of a modeled frequency response of an analog filter of the hybrid ALC system, in accordance with the disclosed principles.

FIG. 7 illustrates graphs 440, 450 showing the detector frequency response, implemented as the LUT 314. Graph 440 represents the frequency response and plots 442 port level (in dBM) versus frequency (MHz). Graph 450 represents the frequency response LUT 314 and plots 452 a scaled response versus the table's index. In accordance with the disclosed principles, the detector linearity may be calibrated at one frequency. The detector frequency response characterizes port level deviation versus frequency for a constant level. In accordance with the disclosed principles, the calibration tables may be splined, normalized to ALC nominal, linearized, and scaled. Table frequency spacing is determined by system requirements and can be broken into multiple bands to relax BRAM requirements.

Referring again to FIG. 4, in the illustrated embodiment, the temperature compensator 320 may have two summers 322, 328 and two mixers 324, 326. The second summer 328 may input a temperature reading temp_sensor from a sensor (e.g., sensor 522 of FIG. 8) at a negative input and a calibrated temperature reading cal_temp at a positive input. The output of the second summer 328, which may be a temperature gain delta ΔTemp, may be input by the second mixer 326. The second mixer 326 may also input a temperature coefficient temp_coeff and outputs the combined result to the first mixer 324. The first mixer 324 may also input the output of the frequency response LUT 314 and may provide the combined result to the first summer 322. The first summer 322 may also input the output of the frequency response LUT 314 and provides a temperature compensated frequency response value (i.e., the result of the summation at summer 322) to mixer 310.

Mixer 310 may also input the output of the linearity LUT 308. The mixed linearity response and temperature compensated frequency response result may be output to summer 312 (received on its negative input), which may input an ALC reference alc_ref on a positive input. The output of summer 312 may be input into the integrator 330, discussed below in more detail.

An ideal analog diode may have to have temperature stability (<0.003 dB/° C.). To model an ideal diode, in accordance with the disclosed principles, any temperature drift prior to the detector may be compensated through feedback and any temperature drift after the detector is negligible (e.g. −0.08 dB/° C.). In one or more embodiments, the temperature coefficient may be characterized during warmup preceding calibration. The coefficient may be linearized over the operating range as determined as follows:

$$Coeff_{lin} = \frac{10^{\frac{T_p \cdot Coeff_{dB}}{20}} - 10^{\frac{T_n \cdot Coeff_{dB}}{20}}}{T_p - T_n}.$$

In one or more embodiments, the control loop error signal may be computed by subtracting the compensated detector reading from a desired reference value. The reference value may be computed according to desired port $V_{PK}$ value (scaled) as shown below:

$$alc\_ref = C \cdot 10^{\frac{Level}{20}}$$

It should be noted that a runtime reference to the calibration tables may not be not required to set this level, which is an advantage of the disclosed principles. In other words, the control signals in the feedback loop may not have to be constantly adjusted as in the conventional systems.

Referring again to FIG. 4, the integrator 330 includes a mixer 338 that inputs the output of summer 312. The integrator 330 also includes a multiplexer 336, which may have a first input connected to a fast gain source 334 and a second input connected to a slow gain source 332. In the illustrated embodiment, the multiplexer 336 may provide dual programmable gain sets: e.g., a fast attack gain for fast settling during level changes and a slow decay gain to maintain level after settling. The gains are selectable/switchable according to an Attack and Decay gate signal attack_nDecay used to control the operation of the multiplexer 336. The multiplexer 336 output (shown as KiTs) may be input by the mixer 338.

The output of the mixer 338 is input by anti-windup logic 340 (e.g., to avoid the signal from overshooting) whose output is passed through logic 342 and an integrator 344 that may create adjustable saturation limits and an initializable accumulator value. The integrator's 344 output is fed back into the anti-windup logic 340, used as the IRQ signal and input by a mixer 242, which also may input the IQ data from the digital upconverter (DUC) 220. The output of the mixer 242 may be IQ data sent to the DAC 252. In accordance with the disclosed principles, the illustrated embodiment includes a discrete integrator implemented via the Forward-Euler method, which may be defined according to the below equation:

$$H(z) = \frac{K_I T_S}{z+1}.$$

Figure 8:
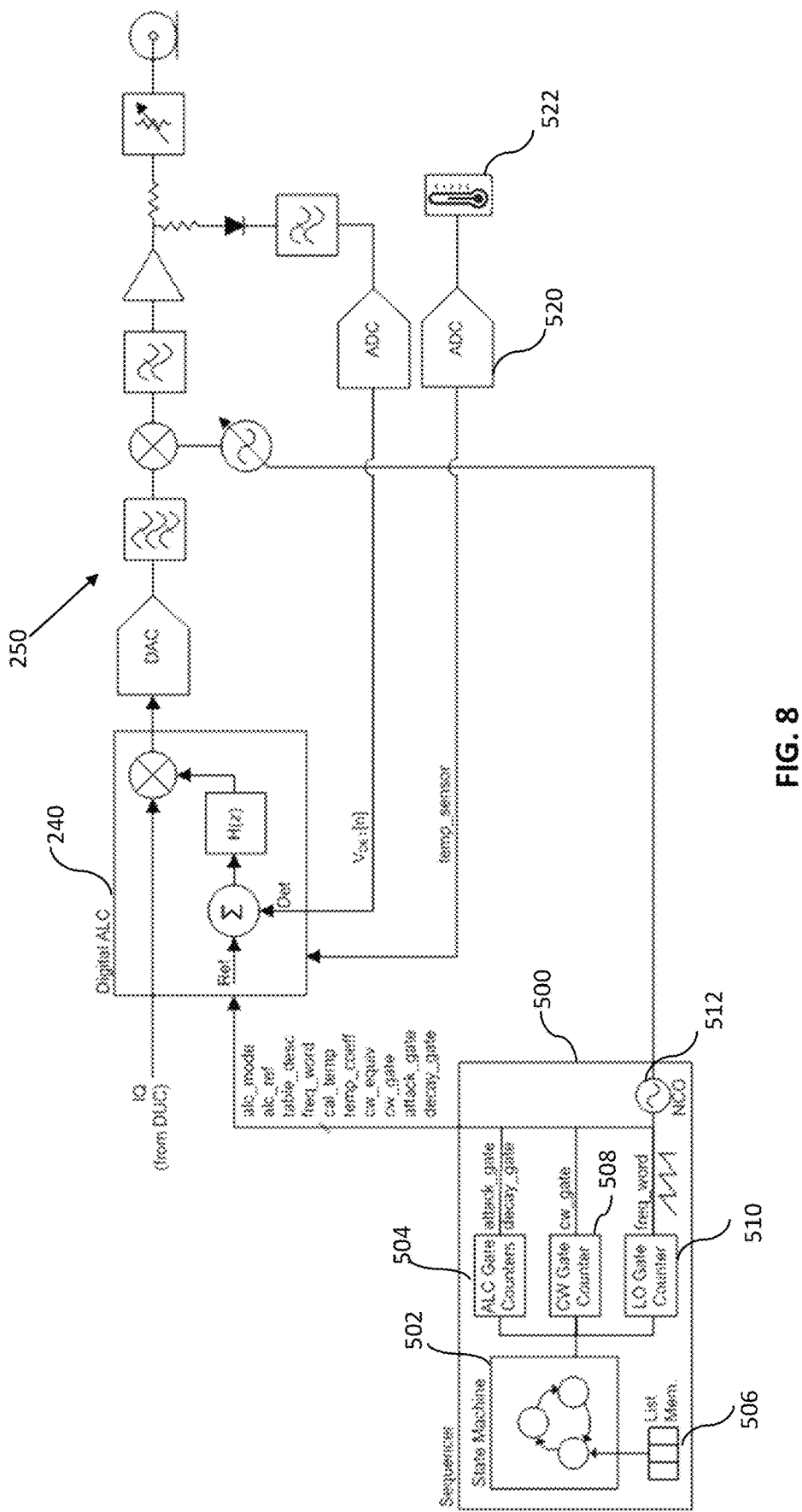
FIG. 8 shows an example of controlling operation of the hybrid ALC system using a sequencer, in accordance with the disclosed principles.

FIG. 8 illustrates an embodiment where the digital ALC's 240 operation is controlled/managed by a sequencer 500 having, among other things, a state machine 502. The state machine 502 may operate from a list stored in memory 506, rendering the state machine 502 a list-based controller that may switch hardware states (output attenuator, filter bands, LO frequency, etc.) to avoid port overshoot and provide control words and gate signals to the digital ALC 240. The illustrated example also includes a temperature sensor 522 whose reading may be input by an ADC 520 before being sent as a temperature sensor signal temp_senor to the digital ALC 240.

The state machine 502 has outputs to ALC gate counters 504, a continuous waveform (CW) gate counter 508, and a local oscillator (LO) gate counter 510. The outputs of the ALC gate counters 504 include an attack_gate signal and a decay gate signal that are input by the digital ALC 240. The output of the CW gate counter 508 includes a cw_gate signal that is input by the digital ALC 240. The output of the LO gate counter 510 includes a freq_word signal that is input by the digital ALC 240. The freq_word signal is also input by a numerically controlled oscillator (NCO) 512 whose output is sent to the analog signal generator circuit 250. Other inputs to the illustrated analog signal generator circuit 250 include an ALC mode signal alc_mode, the ALC ref signal alc_ref, hardware descriptors table_desc, calibrated temperature reading cal_temp, temperature coefficient temp_coeff, and a continuous wave equivalent signal cw_equiv. In one or more embodiments, ALC mode signal alc_mode may have a first value "on" indicative of continuous ALC operation for modulations with constant envelope, "sample and hold" indicative of ALC operation for modulations with non-constant envelope, or "table" where the ALC operation is disabled (allowing for pure open level control).

Figure 9:
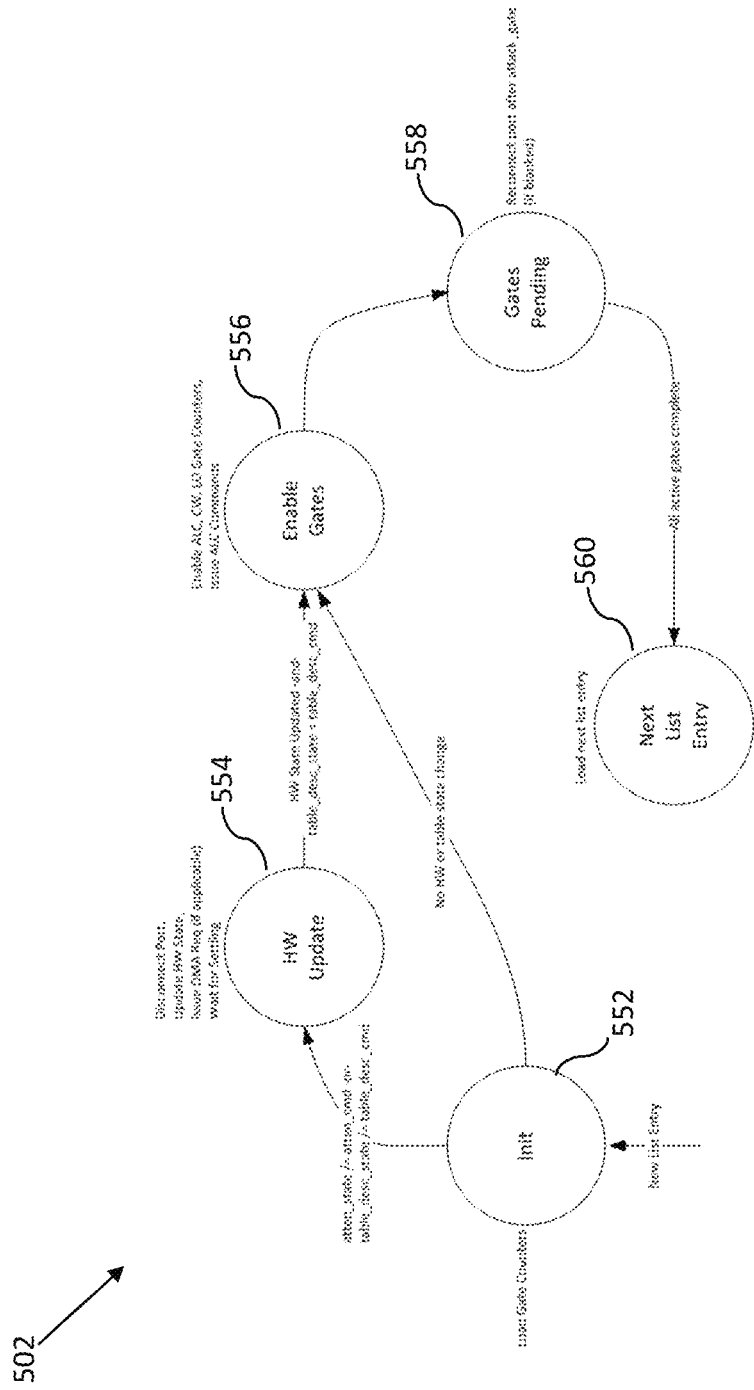
FIG. 9 shows an example of a state machine for controlling operation of the hybrid ALC system, in accordance with the disclosed principles.

FIG. 9 illustrates the state machine 502 in more detail showing processing for the "on" ALC mode (i.e., alc_mode has the value corresponding to "on"). This may be referred to as the simple mode because it provides continuous ALC. In one or more embodiments, this is suitable for CW; constant envelope; and Low-rate sweeps. The illustrated state machine includes an initialization state 552 ("init"), hardware update state 554 ("HW update"), enable gates state 556, gates pending state 558 and a next list entry state 560.

The illustrated initialization state 552 inputs a new list entry and loads gate counters. If the atten_state is not equal to the atten_cmd or if the table_desc_state is not equal to the table_desc_cmd, then there may have been a hardware change and the state machine 502 continues at the hardware update state 554. Actions performed during the hardware update state 554 may include disconnecting the port, updating the hardware state, issuing a DMA request (if applicable) and or waiting for settling. In addition, the HW state is set to updated and the table_desc_state is set to the table_desc_cmd. The state machine 502 continues at the enable gates state 556. If, however, the atten_state is equal to the atten_cmd and the table_desc_state is equal to the table_desc_cmd, then the state machine 502 continues at the enable gates state 556.

The illustrated enable gates state 556 may enable ALC, CW, and LO gate counters. In addition, the enable gates state 556 may issue ALC commands. The state machine 502 continues at the gates pending state 558 where the port may be reconnected after attack_gate (if blanked). The state machine 502 continues at the next list entry state 560 where the next list entry is loaded.

Figure 10:
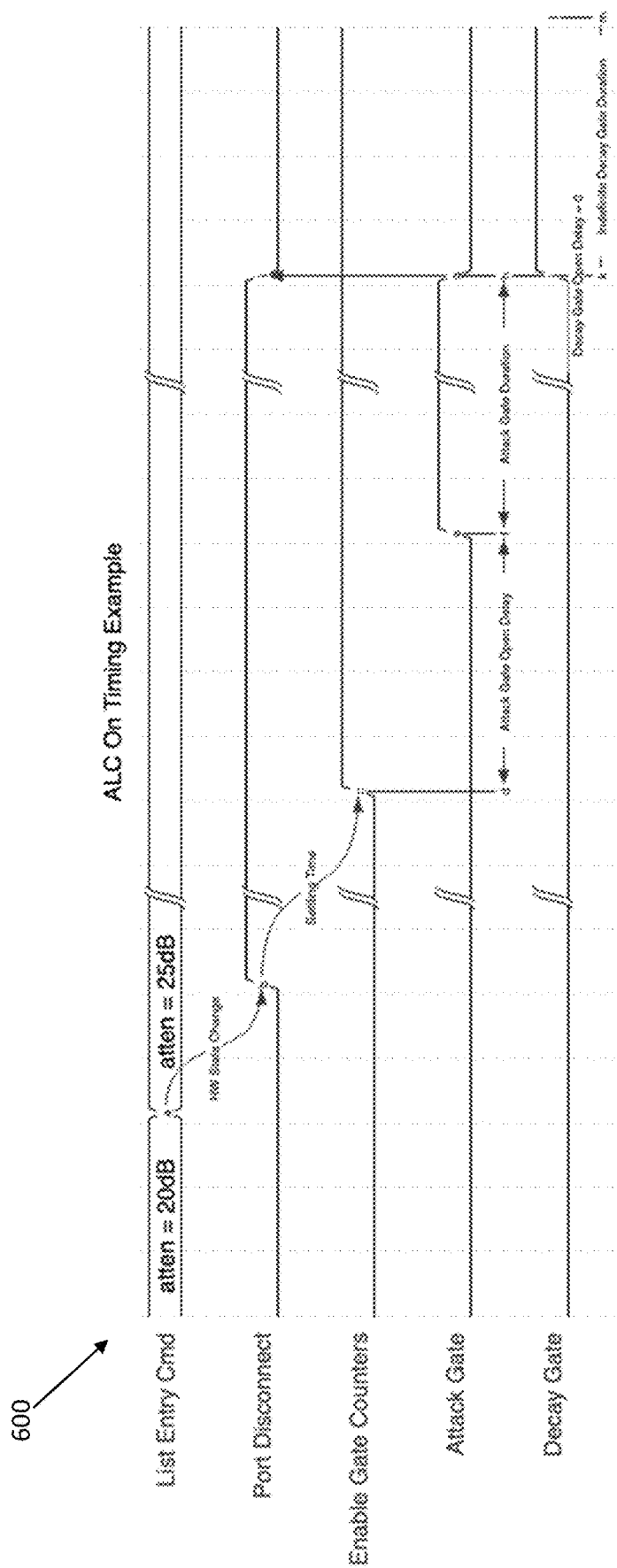
FIG. 10 shows an example timing diagram of a mode of operation of the hybrid ALC system, in accordance with the disclosed principles.

FIG. 10 illustrates an example timing diagram 600 for the "on" ALC mode. In the illustrated example, a list entry command ("List Entry Cmd") setting the attenuation to 20 db is input into the state machine 502 and is determined to be a hardware state change at time a (e.g., at the initialization state 552). The change causes the state machine 502 to continue at the hardware update state 554 where the port is disconnected at time b. The state machine 502 continues at the enable gates state 556 to enable gate counters at time c. Other timing includes the attack gate open delay between times d and e, the attack gate duration between times f and h and the reconnection of the port at time i (during the gates pending state 558). Timing for decay gate open delay equal to 0 and indefinite decay gate duration are also shown.

Figure 11:
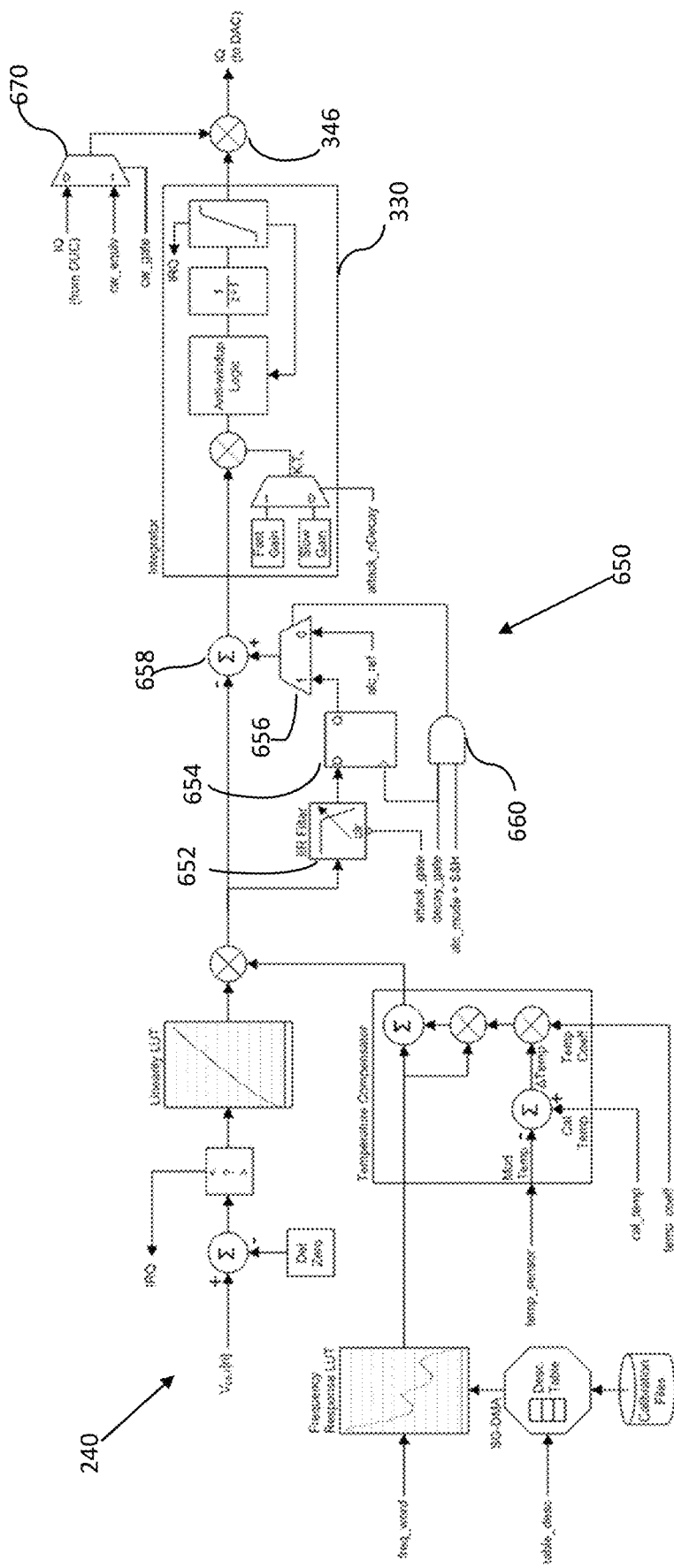
FIG. 11 shows an example operation of the hybrid ALC system, in accordance with the disclosed principles.
Figure 12:
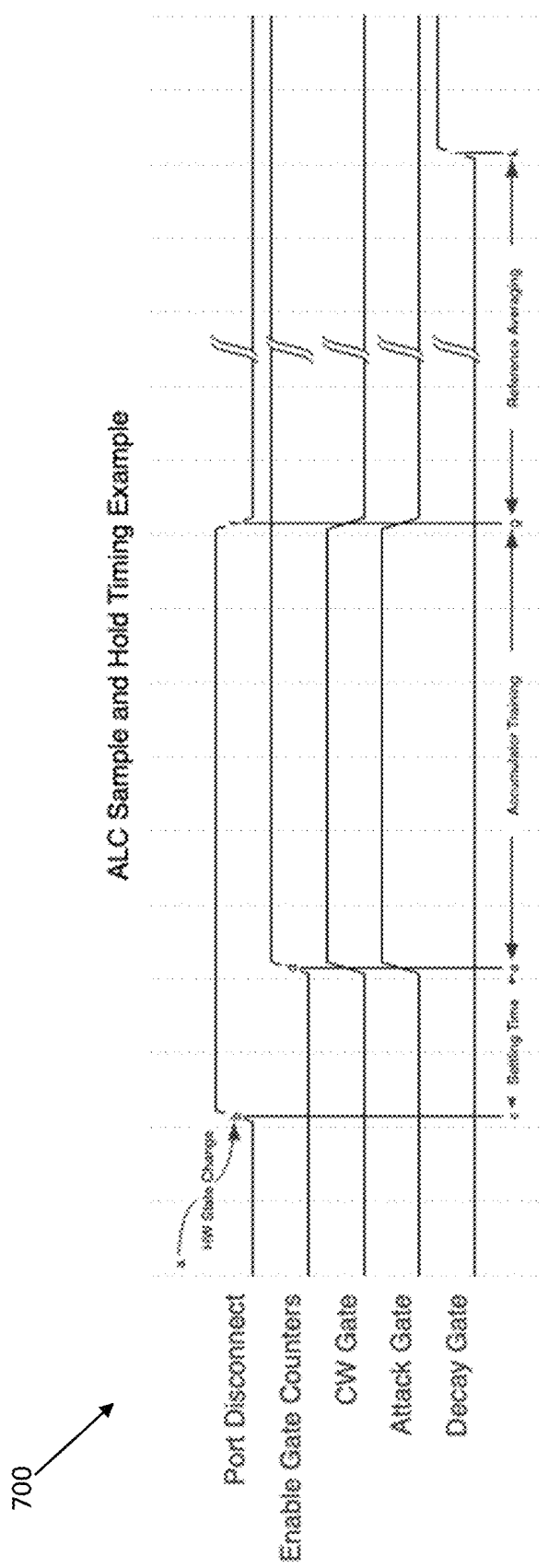
FIG. 12 shows an example timing diagram of another mode of operation of the hybrid ALC system, in accordance with the disclosed principles.

For modulations with non-constant envelope, the ALC mode may be set to sample and hold. Referring to FIGS. 11 and 12, it will become evident that the ALC accumulator may be trained to the CW signal with an equivalent modulation power/carrier level. In one or more embodiments, modulation may be re-enabled at the de-assertion of the CW gate. In addition, or alternatively, between the attack gate de-assertion and decay gate assertion the ALC may be held and the detector value may be averaged with the lowpass filter (e.g., corner and averaging period set by modulation rate). The ALC reference value may be switched to an averaged detector value at the assertion of the decay gate and the decay gain may maintain an equivalent level against temperature drift (e.g., it can be disabled entirely).

In the illustrated embodiment, between the digital ALC 240 and integrator 330, there exists circuitry 650 for implementing the sample and hold circuitry mode. The circuitry 650 includes an infinite impulse response (IIR) filter 652, a latch 654 (shown as a D-Q flip flop), multiplexer 656, summer 658, and an AND gate 660. The filter 652 inputs the output of the ALC 240 and maybe controlled by the attack_gate signal. The AND gate 660 inputs the decay_gate signal and the alc_mode that is set to sample and hold (shown as S&H). The decay_gate signal is used to clock the latch 654, which inputs the output of the IIR filter 652 at its D terminal and provides a latched output from its Q terminal.

The output of the latch 654 is connected to a first input of the multiplexer 656. The second input of the multiplexer 656 is connected to the alc_ref signal. The output of the multiplexer 656 is provided to a positive input of the summer 658. The other input of the summer 658 is connected to the output of the ALC 240. The output of the summer 658 is input by the integrator 330. In the illustrated example, the output of the integrator 330 is applied to the mixer 346. A multiplexer 670 controlled by the cw_gate signal inputs IQ from the DUC and the cw_equiv signal, which are selectively output from the multiplexer 670 based on the cw_gate signal.

FIG. 12 illustrates an example timing diagram 700 for the "sample and hold" ALC mode. In the illustrated example, it is presumed that AM is 100% with a 1 kHz modulation rate, LPF BW=100 Hz, τ=1.59 ms, reference averaging time=9.54 ms (6–tau); and the decay gain is set for a loop bandwidth of 10 Hz. In the illustrated example, a port disconnect signal is asserted after a hardware state change was detected from time a to time b. The assertion starts a settling time at time c that lasts until time e. At time d (corresponding to time e), the enable gate counters, CW gate, attack gate and decay gate signals are asserted. Accumulator training occurs between times e and g. At time f (corresponding to time g), the asserted signals are de-asserted. Reference averaging may occur between times g and k.

Figure 13:
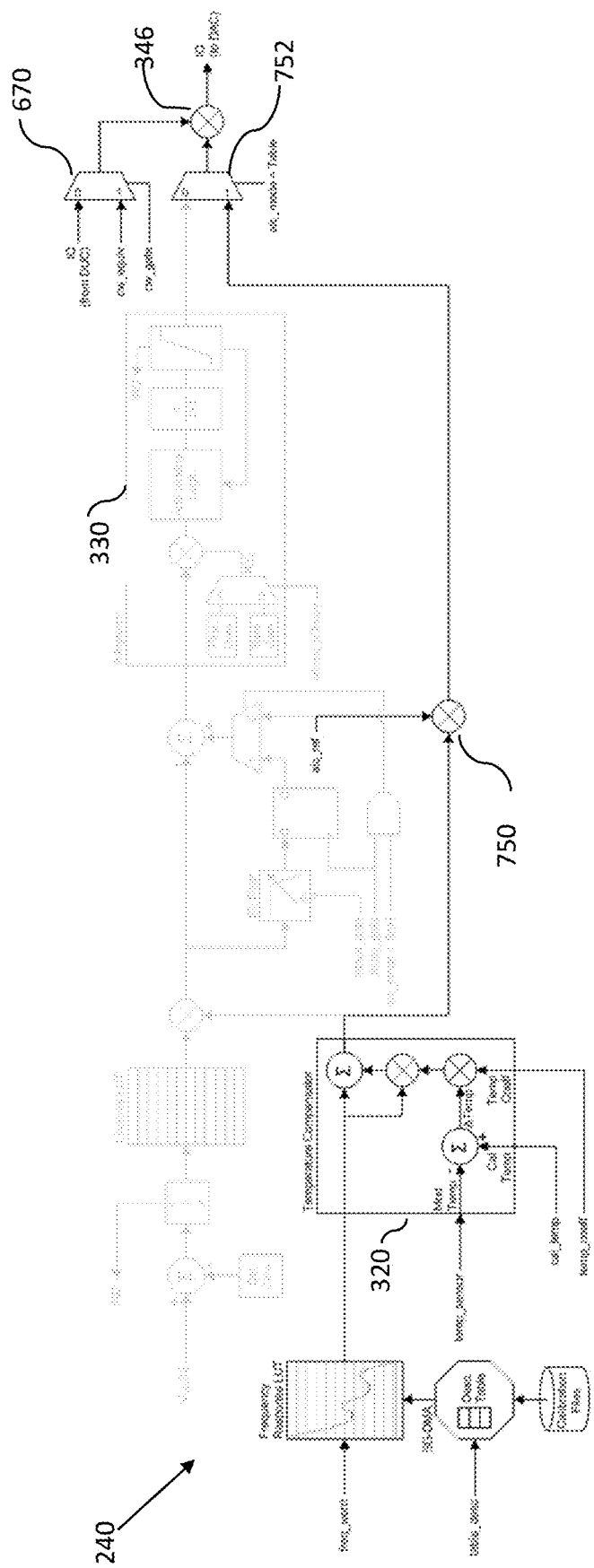
FIG. 13 shows another example operation of the hybrid ALC system, in accordance with the disclosed principles.

For pure open level control, the ALC mode may be set to table. Referring to FIG. 13, it will become evident that in this mode, there may be degraded accuracy, but rapid level changes may be provided. This mode may be suitable for fast sweeps where the combination of sweep rate and frequency response is greater than the ALC loop bandwidth. In addition, the frequency word may change on every clock cycle In the illustrated example, a mixer 750 inputs the output of the temperature compensator 320 and the alc_ref signal. The output of the mixer 750 is input by a multiplexer 752 controlled by the alc_mode signal (set to table). The other input of the multiplexer 752 is connected to the output of the integrator 330. The output of the multiplexer 752 is input by mixer 346, which also inputs the output of multiplexer 670 as discussed above.

While various embodiments have been described above, it should be understood that they have been presented by way of example and not limitation. It will be apparent to persons skilled in the relevant art(s) that various changes in form and detail can be made therein without departing from the spirit and scope. In fact, after reading the above description, it will be apparent to one skilled in the relevant art(s) how to implement alternative embodiments. For example, other steps may be provided, or steps may be eliminated, from the described flows, and other components may be added to, or removed from, the described systems. Accordingly, other implementations are within the scope of the following claims.

In addition, it should be understood that any figures which highlight the functionality and advantages are presented for example purposes only. The disclosed methodology and system are each sufficiently flexible and configurable such that they may be utilized in ways other than that shown.

Although the term "at least one" may often be used in the specification, claims and drawings, the terms "a", "an", "the", "said", etc. also signify "at least one" or "the at least one" in the specification, claims and drawings.

Finally, it is the applicant's intent that only claims that include the express language "means for" or "step for" be interpreted under 35 U.S.C. 112(f). Claims that do not expressly include the phrase "means for" or "step for" are not to be interpreted under 35 U.S.C. 112(f).

What is claimed is:

1. An automatic level control system comprising:
   an analog circuit configured to provide a modulated analog output;
   a digital circuit configured to control the modulated analog output; and a feedback loop from the analog circuit to the digital circuit and configured to transmit the level of the modulated analog output to the digital circuit,
wherein the digital circuit is further configured to drive a digital-to-analog converter interfacing the analog circuit to control the level of the modulated analog output based on an input from the feedback loop, and
wherein the digital circuit further comprises a lookup table configured to model a linear response of an analog diode.

2. The automatic level control system of claim 1, wherein the modulated output comprises a radio frequency signal.

3. An automatic level control system comprising:
an analog circuit configured to provide a modulated analog output;
a digital circuit configured to control the modulated analog output; and
a feedback loop from the analog circuit to the digital circuit and configured to transmit the level of the modulated analog output to the digital circuit,
wherein the digital circuit is further configured to drive a digital-to-analog converter interfacing the analog circuit to control the level of the modulated analog output based on an input from the feedback loop and the digital circuit further comprises a lookup table configured to model a frequency response of an analog filter.

4. The automatic level control system of claim 3, wherein the lookup table comprises frequency words configured to model levels at a plurality of frequencies of the analog filter.

5. The automatic level control system of claim 3, further comprising a temperature compensation circuit configured augment the frequency response modelled by the lookup table.

6. An automatic level control system comprising:
an analog circuit configured to provide a modulated analog output;
a digital circuit configured to control the modulated analog output; and
a feedback loop from the analog circuit to the digital circuit and configured to transmit the level of the modulated analog output to the digital circuit,
wherein the digital circuit is further configured to drive a digital-to-analog converter interfacing the analog circuit to control the level of the modulated analog output based on an input from the feedback loop and the digital circuit further comprises a state machine configured to model an analog control signal.

7. A method of automatic level control, the method comprising:
providing, by an analog circuit of an automatic level controller, a modulated analog output;
controlling, by a digital circuit of the automatic level controller, the modulated analog output;
transmitting, by a feedback loop from the analog circuit to the digital circuit, a level of the modulated analog output to the digital circuit;
driving, by the digital circuit, a digital-to-analog converter interfacing the analog circuit to control the level of the modulated analog output based on an input received from the feedback loop; and
modeling, by a lookup table of the digital circuit, a linear response of an analog diode.

8. The method of claim 7, wherein the modulated output comprises a radio frequency signal.

9. A method of automatic level control, the method comprising:
providing, by an analog circuit of an automatic level controller, a modulated analog output;
controlling, by a digital circuit of the automatic level controller, the modulated analog output;
transmitting, by a feedback loop from the analog circuit to the digital circuit, a level of the modulated analog output to the digital circuit;
driving, by the digital circuit, a digital-to-analog converter interfacing the analog circuit to control the level of the modulated analog output based on an input received from the feedback loop; and
modeling, by a lookup table of the digital circuit, a frequency response of an analog filter.

10. The method of claim 9, further comprising:
modeling, by frequency words of the lookup table, levels at a plurality of frequencies of the analog filter.

11. The method of claim 9, further comprising:
augmenting, by a temperature compensation circuit of the automatic level controller, the frequency response modelled by the lookup table.

12. A method of automatic level control, the method comprising:
providing, by an analog circuit of an automatic level controller, a modulated analog output;
controlling, by a digital circuit of the automatic level controller, the modulated analog output;
transmitting, by a feedback loop from the analog circuit to the digital circuit, a level of the modulated analog output to the digital circuit;
driving, by the digital circuit, a digital-to-analog converter interfacing the analog circuit to control the level of the modulated analog output based on an input received from the feedback loop; and
modeling, by a state machine of the digital circuit further, an analog control signal.

13. An automatic level control circuit comprising:
an analog portion configured to provide a modulated analog output;
a digital portion configured to control the modulated analog output; and
a feedback loop from the analog portion to the digital portion and configured to transmit the level of the modulated analog output to the digital portion,
wherein the digital portion is further configured to drive a digital-to-analog converter interfacing the analog portion to control the level of the modulated analog output based on input received from the feedback loop and the digital portion further comprises a lookup table configured to model a linear response of an analog diode.

14. An automatic level control circuit comprising:
an analog portion configured to provide a modulated analog output;
a digital portion configured to control the modulated analog output; and
a feedback loop from the analog portion to the digital portion and configured to transmit the level of the modulated analog output to the digital portion,
wherein the digital portion is further configured to drive a digital-to-analog converter interfacing the analog portion to control the level of the modulated analog output based on input received from the feedback loop and the digital portion further comprises a lookup table configured to model a frequency response of an analog filter.

15. The automatic level control circuit of claim 14, wherein the lookup table comprises frequency words configured to model levels at a plurality of frequencies of the analog filter.

16. The automatic level control circuit of claim 14, further comprising a temperature compensation portion configured augment the frequency response modelled by the lookup table.

17. An automatic level control circuit comprising:
  an analog portion configured to provide a modulated analog output;
  a digital portion configured to control the modulated analog output; and
  a feedback loop from the analog portion to the digital portion and configured to transmit the level of the modulated analog output to the digital portion,
  wherein the digital portion is further configured to drive a digital-to-analog converter interfacing the analog portion to control the level of the modulated analog output based on input received from the feedback loop and the digital portion further comprises a state machine configured to model an analog control signal.

* * * * *